United States Patent [19]

Mohebban

[11] Patent Number: 4,838,653

[45] Date of Patent: Jun. 13, 1989

[54] LIQUID CRYSTAL DISPLAY WITH PARTICULAR RELATIONSHIP OF THE CAPACITANCES

[75] Inventor: Manoochehr Mohebban, Foster City, Calif.

[73] Assignee: Raychem Corporation, Menlo Park, Calif.

[21] Appl. No.: 197,771

[22] PCT Filed: Jul. 22, 1986

[86] PCT No.: PCT/US87/01756

§ 371 Date: Mar. 18, 1988

§ 102(e) Date: Mar. 18, 1988

[87] PCT Pub. No.: WO88/00717

PCT Pub. Date: Jan. 28, 1988

[51] Int. Cl.⁴ .............................................. G02F 1/13
[52] U.S. Cl. .................... 350/332; 350/335; 350/350 S
[58] Field of Search ..................... 350/335, 350 S, 332

[56] References Cited

U.S. PATENT DOCUMENTS

| | | | |
|---|---|---|---|
| 3,627,408 | 8/1981 | Fergason | 350/331 R |
| 3,667,039 | 5/1972 | Garfein et al. | 350/336 |
| 3,957,349 | 5/1976 | Nelson | 350/332 |
| 4,286,210 | 12/1971 | Ignajev | 350/331 R |
| 4,440,473 | 4/1984 | Sekimoto | 350/332 |
| 4,479,118 | 10/1984 | Cole, Jr. | 340/663 |
| 4,591,233 | 5/1986 | Fergason | 350/334 |
| 4,645,303 | 2/1987 | Sekiya et al. | 350/332 |
| 4,712,877 | 12/1987 | Okada et al. | 350/334 |
| 4,728,122 | 3/1988 | Cannella | 350/332 |
| 4,728,174 | 3/1988 | Grinberg et al. | 350/332 |
| 4,738,514 | 4/1988 | Stewart | 350/332 |
| 4,738,515 | 4/1988 | Okada et al. | 350/332 |
| 4,767,192 | 8/1988 | Chang et al. | 350/332 |

FOREIGN PATENT DOCUMENTS 2949561 6/1981 Fed. Rep. of Germany .
3308972 9/1983 Fed. Rep. of Germany .
3219703 12/1983 Fed. Rep. of Germany .
3403655 8/1985 Fed. Rep. of Germany .

*Primary Examiner*—Stanley D. Miller
*Assistant Examiner*—Anita E. Pellman
*Attorney, Agent, or Firm*—Edith A. Rice; Herbert G. Burkard; Yuan Chao

[57] ABSTRACT

A display comprises an array of a plurality of liquid crystal elements electrically connected in series. The element with the lowest capacitance when energized comprises a liquid crystal material having a positive dielectric anisotropy so that it has a higher capacitance when energized than when non-energized. A second of the elements has a capacitance when non-energized lower than the capacitance of the first element when it is energized. The display can be used for detecting a voltage or an electric field.

10 Claims, 4 Drawing Sheets

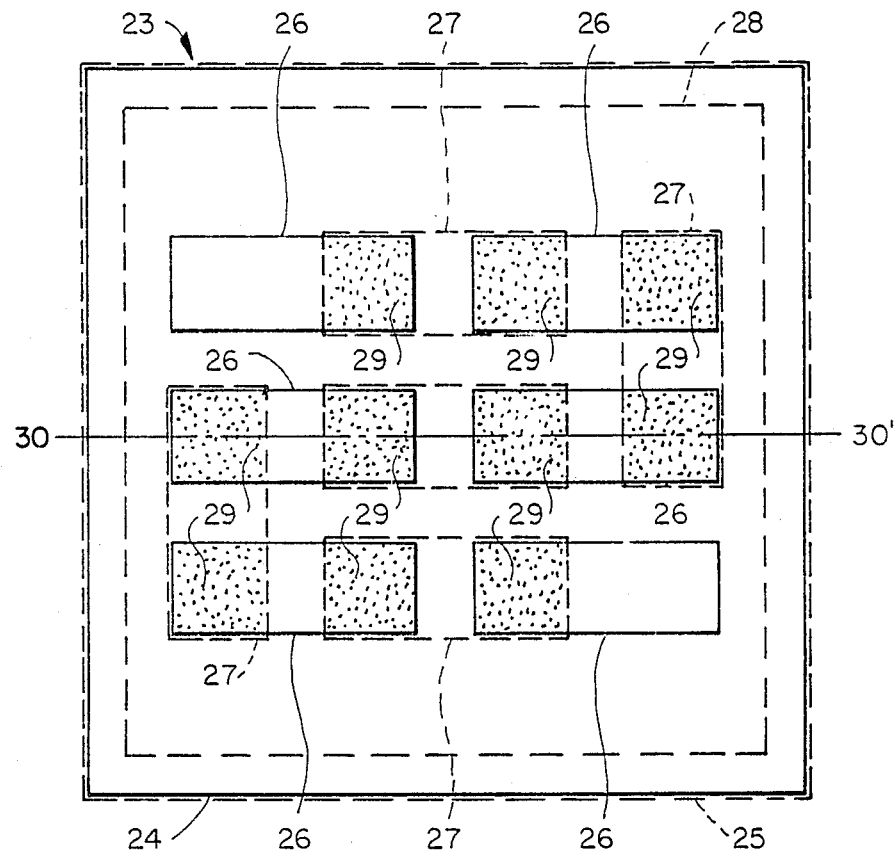
FIG_1
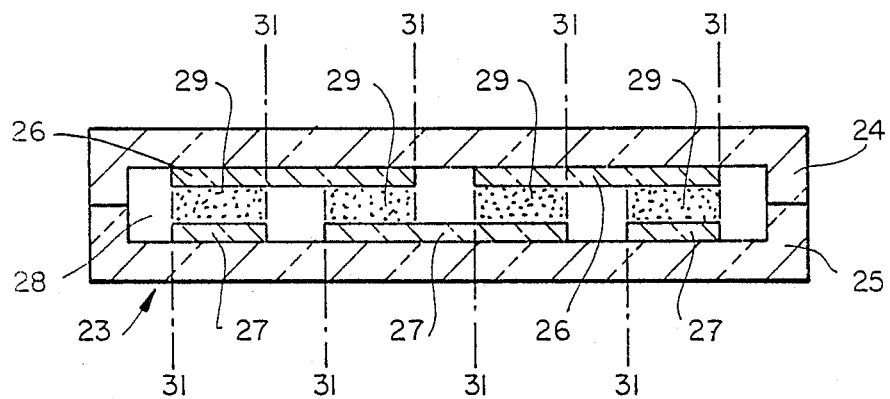
FIG_2

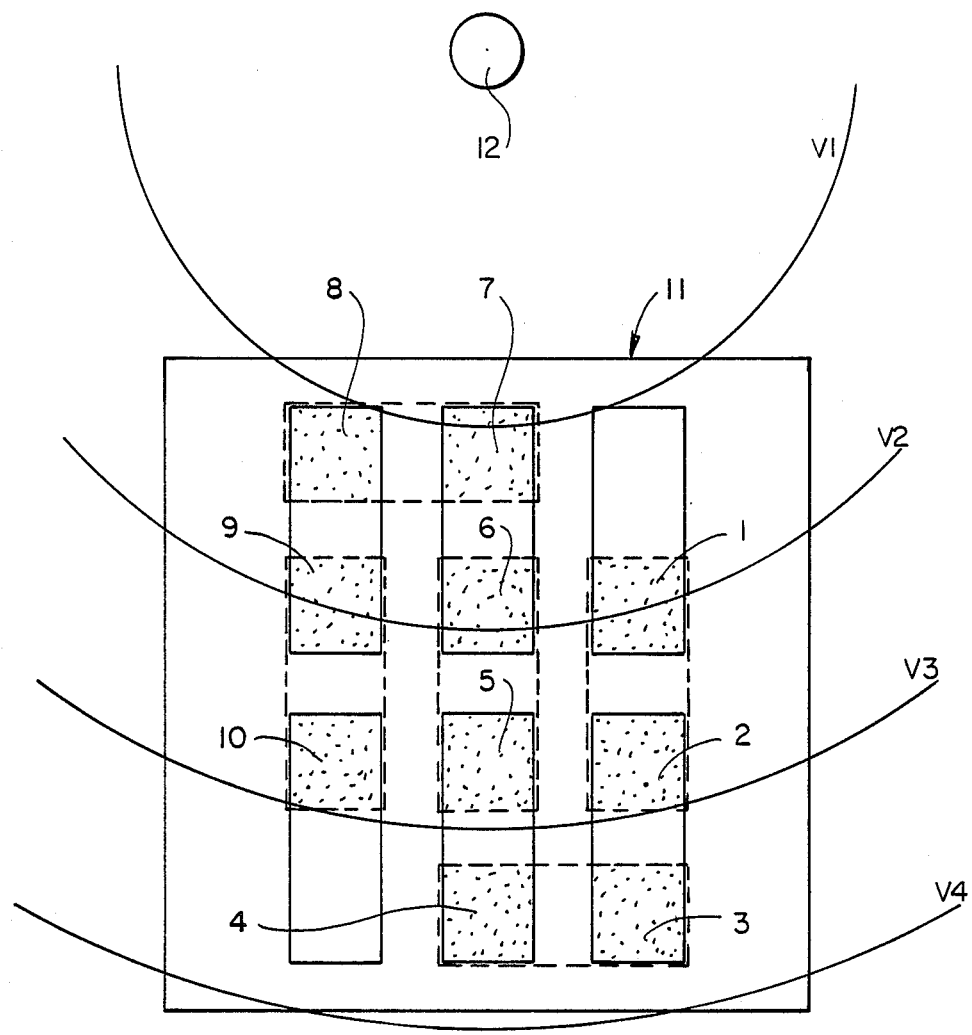
FIG_3

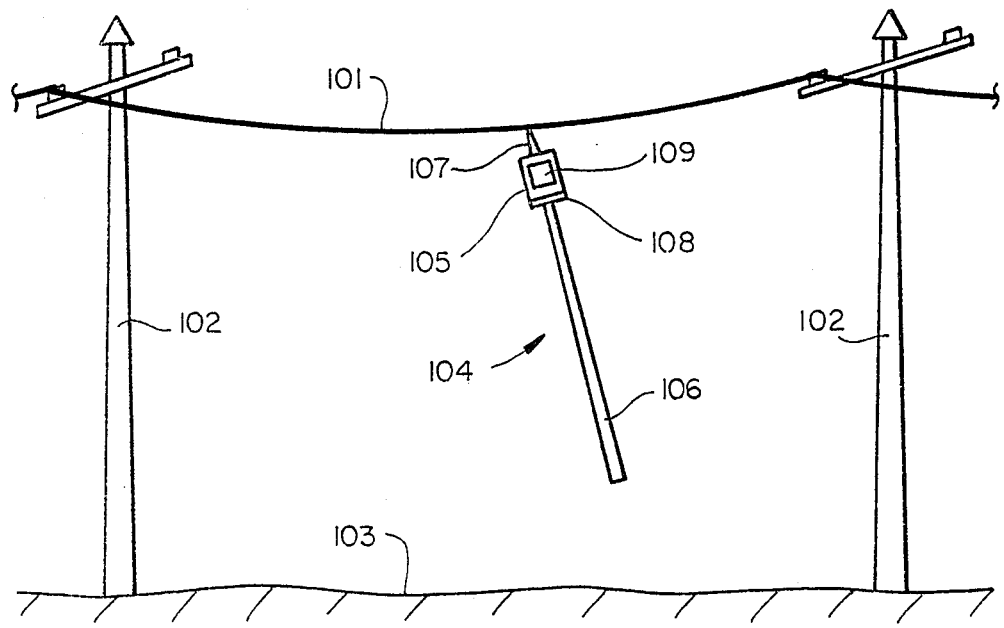
FIG_4

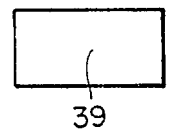
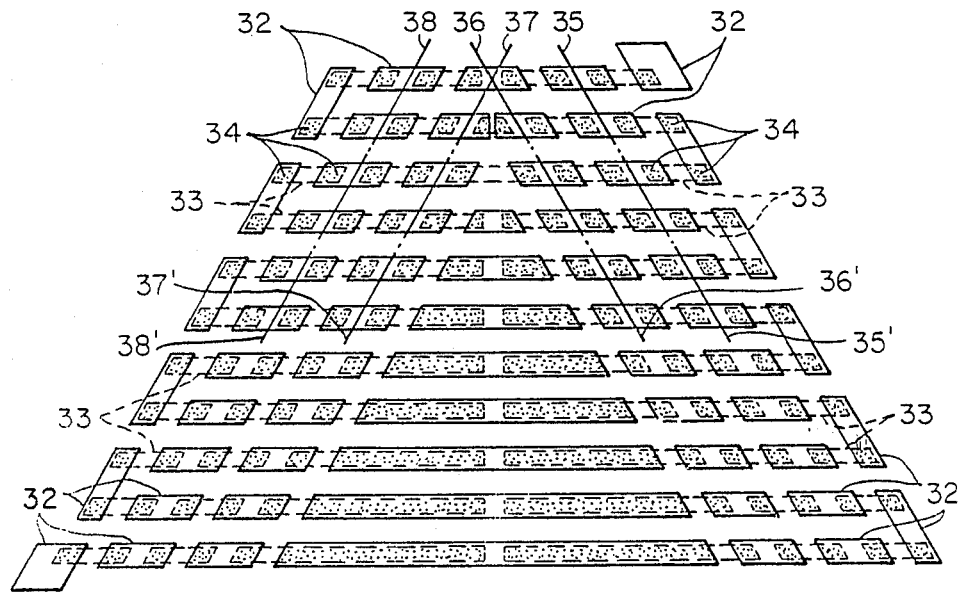
FIG_5
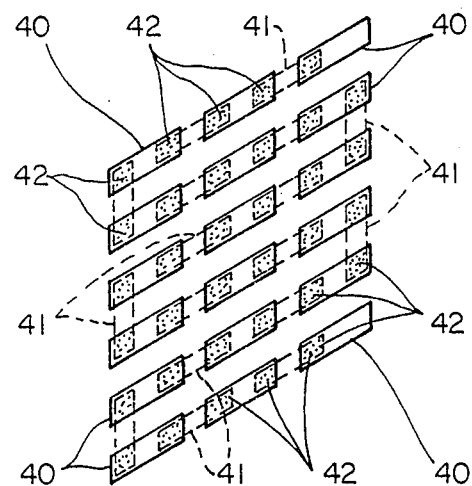
FIG_6

LIQUID CRYSTAL DISPLAY WITH PARTICULAR RELATIONSHIP OF THE CAPACITANCES

This invention relates to a large, low current, liquid crystal display, a method of making such a display and to methods of using said display to detect a voltage or an electric field.

The use of a liquid crystal display to detect a voltage or an electric field is disclosed in the art. For example, German Patent Application No. 2,949,561 to Walter discloses an analog voltage display which uses liquid crystals. The liquid crystal device comprises a number of liquid crystal display areas formed by an overlapping electrode pattern. Each successive display area is sized so that it is not activated in the same voltage range as any preceeding display area. As a result of this requirement, the individual display areas become large so that when it is used to indicated more than about five different voltages, the device requires significant current for its operation. This limits practicality of the device.

U.S. Pat. No. 4,286,210 to Ignatjev discloses a device used to detect the presence of air ions or an electric field. The device of Ignatjev utilizes a single liquid crystal element having electrodes which are connected to large metal plates, at least one of which is grounded through the person operating the device. Use a single liquid crystal element limits the size of the display making it difficult to observe at a distance.

The detection or measurement of a voltage or an electric field using a liquid crystal device is also disclosed in U.S. Pat. No. 3,627,408 of Fergason, German patent applications Nos. 3,219,703 of Kehr, 3,308,972 of Haverhagen et al and 3,402,655 of Goehlich. In each instance, a single liquid crystal display is used and/or the device would require significant current if used in practical display sizes.

I have discovered how to increase the size of a liquid crystal display to produce a large display which utilizes relatively low current and can be used for detecting and/or measuring a voltage or an electric field.

One aspect of the invention comprises a liquid crystal display comprising an array of a plurality of liquid crystal elements, said array comprising:

(a) a first liquid crystal element having a capacitance in the non-energized state lower than the capacitance of any other of said liquid crystal elements and comprising a liquid crystal material having a positive dielectric amisotropy so that said liquid crystal element has a capacitance in the energized state higher than its capacitance in the nonenergized state; and (b) a second liquid crystal element electrically connected in series with said first liquid crystal element, said second liquid crystal element having a capacitance in the non-energized state lower than the capacitance of the first liquid crystal element in its energized state.

Another aspect of this invention comprises a method of making a display comprising an array of a plurality of liquid crystal elements connected in series, said method comprising:

(a) providing first and second support members;

(b) providing said first support member with electrodes in a first predetermined pattern;

(c) providing said second support member with electrodes in a second predetermined pattern, said first and second patterns being such that when the support members are superimposed and aligned, the electrodes of said first support member partially overlap the electrodes of said second support member providing areas of overlap;

(d) positioning a layer of liquid crystal material having a positive dielectric anisotropy between said first and second support members;

(e) superimposing and aligning said support members such that their respective electrodes are facing said liquid crystal layer and the overlap areas of the electrodes with liquid crystal material therebetween form a plurality of liquid crystal elements connected in series by the overlapping electrodes, said array having a first liquid crystal element having a capacitance in the non-energized state lower than the capacitance of any other liquid crystal element and a second liquid crystal element having a capacitance in the non-energized state lower than the capacitance of the first liquid crystal element in its energized state; and (f) laminating the resulting structure.

A further aspect of this invention comprises a method of detecting the presence of an electric field in a given area, comprising positioning a liquid crystal display in accordance with claim 1 in said area and observing the optical state of said liquid crystal display.

Yet another aspect of this invention comprises a method of detecting a voltage which comprises ohmically connecting at least one lead of a voltage source to a display in accordance with claim 1.

FIG. 1 shows a display of this invention comprising a plurality of liquid crystal elements electrically connected in series.

FIG. 2 is a cross-sectional view of the device of FIG. 1.

FIG. 3 shows the utilization of a display of this invention to detect the presence of an electric field.

FIG. 4 shows the use of a display of this invention in which one terminal of the display is semi-ohmically connected to a voltage source.

FIG. 5 shows another device of this invention in which a plurality of liquid crystal elements some of which are larger than others to provide an indication of the level of voltage.

FIG. 6 shows yet another display of this invention comprising a plurality of liquid crystal elements connected in series.

The display of this invention comprises a plurality of liquid crystal elements electrically connected in series. The liquid crystal elements can be discrete elements electrically connected in series by means of conductors such as wires or the like. In preferred embodiments, as discussed below, the display comprises a laminar structure comprising a plurality of liquid crystal elements which are interconnected by overlapping electrodes. The electrodes extending between the elements provide a greater conductive surface area between the elements than does a connecting wire and improve the sensitivity of the display.

Each liquid crystal element comprises a pair of opposing electrodes with liquid crystal material in between. The liquid crystal material in at least the first liquid crystal element, i.e. the element which in its non-energized state has the lowest capacitance of those in the display, has a positive dielectric anisotropy which means that the capacitance of the element when energized, i.e. turned on, is greater than its capacitance when non-energized. Preferably the liquid crystal material used in each of the elements has a positive dielectric anisotropy.

The liquid crystal display comprises a second liquid crystal element which has a capacitance in its non-energized state lower than the capacitance of the first element in its energized state. Thus when a voltage is applied to the display, the first element will be energized first due to its low capacitance and its capacitance will then increase due to its positive dielectric anisotropy. The second element will then have a lower capacitance than the energized first element and there will be a redistribution of the voltage so that there will be less voltage across the first element than there was before it was energized. This serves to protect the first element from damage due to overvoltage making the need of protective components such as Zener diodes unnecessary. If the voltage of the source is high enough, and preferably it will be, the second element will also be energized, or activated. Both elements will then be "turned on" making it easier to observe the change. Typically, the liquid crystal elements may not be activated simultaneously. They are activated out of phase as voltage is distributed across them. As a result the total voltage required to activate both liquid crystal elements can be less than twice the threshold voltage of the liquid crystal elements, the threshold voltage being the voltage at which the liquid crystal element begins to turn on. While the liquid crystal elements may not be activated simultaneously, the time lapse between activation of the first and activation of the second is too small to be detectable by the human eye. To the observer both turn on simultaneously.

Preferably the liquid crystal display comprises more than two liquid crystal elements, more preferably at least five and most preferably at least ten, liquid crystal elements. In preferred embodiments of the invention, the elements of the array are substantially the same size and a plurality of the liquid crystal elements, preferably all of them, are energized substantially simultaneously when a voltage is applied. Thus, instead of a single liquid crystal element becoming visible, as in prior art devices such as that of Ignatjev, a number of liquid crystal elements are activated and the display can be readily seen even at a distance. The optimum number of liquid crystal elements varies depending on the application.

As described more fully below, each liquid crystal element is a fraction of the size of the largest single liquid crystal element which can be energized by the given source under comparable conditions. However, with a plurality of these smaller elements being connected in series the size of the display is greater than the size of the single liquid crystal element. Also, because each individual liquid crystal element is smaller than the single liquid crystal element it has a higher imoedance. Connecting the individual liquid crystal elements in series further increases the impedance. As a result the current required to energize the display is greatly reduced thus providing a low current, large liquid crystal display.

The array of liquid crystal elements connected in series can be used alone or can be incorporated into a device such as a "hot stick". A display comprising the array may incorporate additional liquid crystal elements. For example a display may comprise a plurality of arrays and at least one of said arrays may be connected in parallel to another of said arrays.

As mentioned above, the liquid crystal material used for at least the first liquid crystal element, and preferably all the liquid crystal elements, has a positive dielectric anisotropy. The liquid crystal materials which can be used include nematic and smectic liquid crystals.

They can be discrete compounds or mixtures. As is well known in the art, liquid crystal materials are often used in blends to extend the temperature range over which they are crystalline, or to achieve other desirable properties not readily achievable with a single compound. They can be of the cyanobiphenyl, benzoate, or Schiff base type, to name a few. They can include a pleochroic dye, to give a colored optical effect. Suitable nematic liquid crystal materials are found in U.S. Pat. No. 4,591,233, the disclosure of which is herein incorporated by reference.

Because a leakage current can discharge the voltage across the conductors, thus preventing the liquid crystal material from transitioning from its non-energized to energized state, it is preferred that the liquid crystal material have a high volume resistivity, by which is meant that the volume resistivity is preferably greater than $1 \times 10^{10}$ ohm-cm.

It is also preferred that the liquid crystal material be an encapsulated liquid crystal material. A liquid crystal material is said to be encapsulated when a quantity thereof is confined in a containment or encapsulation medium or material. Encapsulated liquid crystal material can be made by mixing together liquid crystal material and an encapsulating medium in which the liquid crystal material will not dissolve and permitting the formation of discrete capsules containing the liquid crystal material. Preferably, the encapsulating medium has a volume resistivity greater than $1 \times 10^{11}$ ohm-cm, for the aforementioned leakage current considerations. A preferred encapsulating medium is poly(vinyl alcohol).

The encapsulated liquid crystal material can be either nematic or smectic. The encapsulation of nematic liquid crystal material is described in U.S. Pat. No. 4,435,047 (Fergason) or U.S. Pat. No. 4,591,233 (Fergason), the disclosures of which are herein incorporated by reference.

The encapsulated liquid crystal material can also be smectic. Encapsulated smectic liquid crystal materials offer an advantage for certain applications, in that they can have "memory," that is, after being energized, i.e. turned on the material remains turned on even after the voltage across the conductors is removed. The material can be returned to its non-energized state by heating. Thus, for applications where it is necessary or desirable to have a semi-permanent indication of the presence of an electric field, encapsulated smectic liquid crystal material is preferred. The encapsulation of smectic liquid crystals is described in U.S. application Ser. No. 740,218 (Fergason), filed Jun. 3, 1985, the disclosure of which is herein incorporated by reference.

As used in this specification, the term "liquid crystal material" includes discrete liquid crystal compounds, blends of liquid crystals, and encapsulated liquid crystals.

The liquid crystal material is positioned between a pair of opposing electrodes. Generally, the electrodes are transparent. However, all that is required is that at least the part of an electrode through which the underlying liquid crystal material is to be viewed be transparent. While a composite electrode can be used, that is, an electrode made of a transparent material only in the viewing areas, it is often more convenient to employ an electrode which is transparent throughout. A preferred electrode material is indium tin oxide (ITO). Other suitable materials are gold, nickel, chromium, titanium oxide, tin oxide, aluminum, antimony tin oxide, and indium oxide.

The electrodes are generally positioned on a support material. The selection of the support material is not critical. Generally, both support materials are as transparent. However, all that is required is that the support material be transparent at least at those places where the underlying liquid crystal material is to be viewed. As with the electrodes, it may be more convenient to employ support material which is transparent throughout. It should also have sufficient mechanical integrity to support and protect the liquid crystal elements and should be a good electrical insulator. It is preferred that the electrode be directly adherent to the support material or be held firmly to it by a suitable adhesive. Suitable support materials include glass and organic polymers, particularly those which are thermoplastic or otherwise conveniently fabricatable into film or sheet form. A preferred support material is poly(ethylene terephthalate), commercially available under the trademark Mylar from DuPont.

While it is preferred that the support material form a hermetically sealed package for the purpose of protecting and electrically insulating the liquid crystal elements inside, such sealing is not required. For example, where the interior materials are not particularly sensitive to environmental moisture or atmospheric oxygen or where long term durability is not critical, the support material need not form a sealed package.

For proper performance, a device of this invention should be constructed so as to distort or interfere with the electric field generated by the electrical component being tested as little as possible. For example, other than the electrodes, the device should have no metallic or electrically conductive elements. The size and shape of the electrodes and their positioning relative to each other should also take into consideration field distortion effects. As discussed below, the display may be provided with one or more terminals for ohmic connection of the array to one or more leads of the voltage source.

FIG. 1 shows a liquid crystal display of this invention. The device 23 has top and bottom support materials 24 and 25, respectively, sealed at the edges. Upper and lower electrical electrodes 26 and 27 are deposited onto the inner surface of top and bottom support materials 24 and 25, respectively. Liquid crystal material 28 having a positive dielectric anisotropy is sandwiched between the support materials and in contact with the electrodes. Each upper electrode 26, except for the first and last ones, overlaps partially with two different lower electrodes 27, and viceversa. In this manner, a sequence of liquid crystal elements 29 electrically connected in series is formed. The liquid crystal elements 29 are substantially equal in size and thus have substantially equal capacitances. Since it is virtually impossible to make all of the elements identical, one will have a capacitance smaller than any of the others and will be activated first. Since the liquid crystal material has a positive dielectric anisotropy as soon as the smallest element is activated, its capacitance increases and the other non-activated liquid crystal elements will then have a lower capacitance than the first. The voltage is then redistributed as mentioned above.

The display of this invention can be used to detect an electric field, including static electricity. FIG. 3 illustrates schematically how a display of this invention consisting of liquid crystal elements 1 through 10 connected in series is used to detect an electric field. A display 11 of the type depicted in FIGS. 1 and 2, is positioned some distance from electrical component 12. Component 12, if it carries a voltage, generates an electric field, represented two-dimensionally by equipotential lines $V_1$, $V_2$, $V_3$, and $V_4$, in decreasing order of potential. The display is positioned so that it extends across at least two equipotential lines. In FIG. 4, the electrodes of element 1 is subject to voltage $V_1$ and the electrodes of element 10 is subject to voltage $V_4$. Since the elements are electrically connected in series there will be a voltage across the elements causing at least some of them to turn on.

The display of this invention is particularly suitable for the detection of the build-up of a static electrical charge. This can be important, for example, in semiconductor manufacturing facilities. A display using a smectic liquid crystal material can be used to indicate the electrostatic field exposure history of a component, printed circuit board or the like, with which it is associated, e.g. by attachment. In another application, where natural gas is transmitted through polymeric pipes, the flow of gas through the pipes can create static electricity. The display provides a service crew with a convenient means for determining if there is any static electricity build-up which could cause a spark and ignite the gas, before entering the pipe to perform maintenance or repairs.

Normally, the detection of static electricity is difficult because the static electricity is discharged by the power consumption requirements of the detection means. However, because the display is a high-impedance, low power consumption one, it can readily be used to detect static electricity.

In detecting a voltage, the display of this invention, can be used semi-ohmically, i.e. with one end of the display only being ohmically connected to the equipment to be connected. The display will be provided with a terminal in contact with a liquid crystal element of the series array for ohmically connecting the array to the voltage source. In this case the free end would be capacitively coupled to the other lead of the source.

Use of the display of this invention by semi-ohmic connection to the source is illustrated in FIG. 4. FIG. 4 shows a high voltage conductor 101 suspended on poles 102 above earth 103. Apparatus of the invention 104 is being used to determine whether conductor 101 is generating an electric field, i.e. whether it is live. Apparatus 104 comprises a device of the invention 105 attached to an insulating hot stick 106. The device 105 comprises a terminal 107 for connection to the conductor 101 and display 109 which is comprised an array of a plurality of liquid crystal elements (individual elements not shown). The hot stick is held such that terminal 107 contacts the conductor 101, and the liquid crystal elements are viewed to give an indication of the presence or absence of a voltage on conductor 101.

The liquid crystal display comprising an array of this invention having n liquid crystal elements connected in series can be much larger than a display consisting of the largest single liquid crystal element of the same material and thickness operable under the given conditions. For semi-ohmic conditions with a voltage source $V_s$, it has been determined that identical individual liquid crystal elements in an array optimally can be a factor of K smaller than the largest operable single liquid crystal element, where $$K = \frac{2(r-1)}{r},$$

where r is $V_s:V_t$, where $V_t$ is the threshold voltage of the liquid crystal element, i.e. the voltage at which it begins to turn on. While each individual element in the array is smaller than the largest operable single element, the array has n individual elements. The optimum number of individual elements, n, has been determined to be r/2. The resulting improvement in size (area of the display versus area of the largest single liquid crystal element) has been determined to be $$\frac{r^2}{4(r-1)},$$

where r is the above defined ratio.

Thus, for a device used with a voltage source of 5000 kV and the largest liquid crystal element capable of being turned on has a threshold voltage of 50. The optimum number of individual liquid crystal elements can be ½ (5000 divided by 50)=50 each being approximately ½ the size of the largest liquid crystal element which would be turned on by 5000 kV applied semi-ohmically. The improvement in size would be a display 25 times larger than the size of the theoretical single LCD.

The optimum increase in impedance, has been determined to be (r−1) and the reduction of current required to be $$\frac{2(r-1)}{r},$$

or approximately by a factor of 2 if r>>1. Thus the display of this invention, when used in a semi-ohmic application, can be about 25 times larger than the largest single liquid crystal element used under comparable conditions but can require only about ½ the current to operate. It is to be understood that these values are given by way of illustration only. Optimum displays are not required for most applications. Displays in which the reduction in size and/or the number of elements is from about 0.75–1.4, especially about 0.85–1.2 times the optimum values are useful in most instances.

The display of this invention can be directly connected across the voltage to be detected and/or measured, i.e. can be ohmic connection ed to the voltage source. This is accomplished by attaching leads from the voltage source to the in series-connected array of liquid crystal elements forming the display. The electrodes of the liquid crystal elements, generally the end elements of the array can be provided the conventional terminals for this purpose.

A display of this invention can be used to measure the level of voltage of a source. For this use the display comprises liquid crystal elements of varying sizes in addition to the first and second liquid crystal elements. This embodiment is described more fully below in Example 2 and FIG. 5.

The following examples illustrate various embodiments of the invention.

EXAMPLE 1

This example illustrates the preparation of a preferred embodiment having a laminated construction. In this embodiment the liquid crystal material is "sandwiched" between two layers of support material, each bearing, on the surface facing the liquid crystal material, a pattern of conductors.

A drawing was made of the desired conductor patterns. Using a conventional photoresist technique, each drawing was transferred onto a sheet of transparent support material (Mylar) which had been coated on one side with ITO. The excess and undesirable ITO was removed, leaving on each sheet of support material a pattern of ITO conductors. One of the sheets was then coated on the conductor side with liquid crystal material mixed with encapsulating medium, from Taliq Corp., Mountain View, Calif. The tacky layer of liquid crystal-encapsulating medium mixture was cured. The other sheet was placed over the encapsulated liquid crystal layer, conductor side facing the liquid crystal material and taking care to ensure that the conductor patterns were properly registered. The sheets were then laminated by heating in an oven, to produce a laminated construction having a plurality o liquid crystal units connected in series.

This particular material is opaque when non-energized and transparent when energized.

EXAMPLE 2

This example illustrates the use of a device of the invention for the detection and estimation of the magnitude of a voltage.

Referring to FIG. 5, a laminated device having upper electrical conductors 32 overlap with lower electrical conductors 33 to form a series of liquid crystal elements 34 electrically connected in series, in much the same manner as depicted earlier in FIG. 1. (For convenience, the support materials and the rest of the liquid crystal material have been omitted, and not each occurrence of upper and lower conductors 32 and 33 and LCD elements 34 is labeled.) The laminate was prepared according to Example 1. The support material was Mylar and the liquid crystal material was encapsulated according to the method of U.S. Pat. No. 4,435,047, previously incorporated herein by reference. The device was vertically positioned 3 inches below the corona bell of a transformer 39 located 4 feet above the ground. The device was held in place with electrical insulating tape. The transformer voltage at which particular LCD elements changed state (went from opaque to transparent) were noted as below:

| LCD Units Changing State | Transformer Voltage (kV) |
| --- | --- |
| All the units except the two center units in each of rows 5–11 | 16 |
| All the units except the two center units in each of rows 6–11 | 45 |
| All the units except the two center units in each of rows 7–11 | 60 |
| All the units except the two center units in each of rows 8–11 | 90 |

(Rows counted from top to bottom)

Thus, by reference to which liquid crystal units have changed state, it is possible to determine what the voltage in the transformer is.

EXAMPLE 3

The device of Example 2 was cut along lines 35–35', 36–36', 37–37', and 38–38', as shown in FIG. 3, and the experiment of Example 2 was repeated.

| LCD Unit | Transformer Voltage (kV) |
| --- | --- |
| Left units of rows 1 and 2; partial turn-on of left units of rows 3 and 4 | 95 |
| Left units of rows 5 and 6 | 102 |
| Some units on right side of rows 1–5 | 125 |

This example shows that when the liquid crystal elements of an array are not all electrically connected in series a higher voltage is required than when they are all series connected and fewer elements are turned on making it more difficult to observe the optical state of the display.

EXAMPLE 4

This example illustrates the use of a device of my invention for the detection of static electricity.

A device having, as depicted in FIG. 6, top conductors 40 and bottom conductors 41 overlapping to form LCD elements 42 electrically connected in series was prepared. (For convenience, in FIG. 6 the representations of the support material and the liquid crystal material have been omitted, and not each occurrence of top and bottom conductors 40 and 41 and LCD elements 42 is labelled.) It had a laminar construction with Mylar as the support material, prepared according to Example 1. The liquid crystal material was encapsulated with poly(vinyl alcohol), by the method of U.S. Pat. No. 4,435,047, previously incorporated herein by reference. Each LCD element was approximately 5×5 mm in cross-sectional area, with liquid crystal material between about 10 and 20 microns thick.

A piece of 2¼ inch poly(vinyl chloride) pipe was charged with static electricity by rubbing its surface with a cloth. The voltage at various points along the pipe was measured by a Simco Model SS-2X electrostatic locator. The device was then brought to a radial distance of 2½ inch from the pipe. Wherever the locator had indicated the presence of a voltage of 7 kV or higher, a transition in one or more LCD elements of the device was observed.

What is claimed is:

1. A liquid crystal display comprising an array of a plurality of liquid crystal elements, said array comprising:
   (a) a first liquid crystal element having a capacitance in the non-energized state lower than the capacitance of any other of said liquid crystal elements and comprising a liquid crystal material having a positive dielectric anisotropy so that said liquid crystal element has a capacitance in the energized state higher than its capacitance in the nonenergized state; and
   (b) a second liquid crystal element connected electrically in series with said first liquid crystal element, said second liquid crystal element having a capacitance in the non-energized state lower than the capacitance of the first liquid crystal element in its energized state.

2. A liquid crystal display in accordance with claim 1, comprising an array of at least five liquid crystal elements, the elements being electrically connected in series.

3. A display in accordance with claim 2, wherein the liquid crystal elements comprise a liquid crystal material having a positive dielectric anisotropy.

4. A display in accordance with claim 3, wherein the liquid crystal material is smectic or nematic.

5. A display in accordance with claim 4, wherein the liquid crystal material is an encapsulated liquid crystal material.

6. A display in accordance with claim 2, wherein the liquid crystal elements are of substantially the same size.

7. A liquid crystal device comprising a plurality of liquid crystal arrays in accordance with claim 1, at least one of said arrays being connected in parallel to at least one other of said arrays.

8. A method of making a display comprising an array of a plurality of liquid crystal elements connected in series, said method comprising:
   (a) providing first and second support members;
   (b) providing said first support member with electrodes in a first predetermined pattern;
   (c) providing said second support member with electrodes in a second predetermined pattern, said first and second patterns being such that when the support members are superimposed and aligned, the electrodes of said first support member partially overlap the electrodes of said second support member providing areas of overlap;
   (d) positioning a layer of liquid crystal material having a positive dielectric anisotropy between said first and second support members;
   (e) superimposing and aligning said support members such that their respective electrodes are facing said liquid crystal layer and the overlap areas of the electrodes with liquid crystal material therebetween form a plurality of liquid crystal elements connected in series by overlapping electrodes, said array having a first liquid crystal element having a capacitance in the non-energized state lower than the capacitance of any other liquid crystal element and a second liquid crystal element having a capacitance in the non-energized state lower than the capacitance of the first liquid crystal element in its energized state; and
   (f) laminating the resulting structure.

9. A method of detecting the presence of an electric field in a given area, comprising positioning a liquid crystal display in said area and observing the optical state of said liquid crystal display; said liquid crystal display comprising an array of a plurality of liquid crystal elements, said array comprising:
   (a) a first liquid crystal element having a capacitance in the non-energized state lower than the capacitance of any other of said liquid crystal elements and comprising a liquid crystal material having a positive dielectric anisotropy so that said liquid crystal element has a capacitance in the energized state higher than its capacitance in the non-energized state; and
   (b) a second liquid crystal element connected electrically in series with said first liquid crystal element, said second liquid crystal element having a capacitance in the non-energized state lower than the capacitance of the first liquid crystal element in its energized state.

10. A method of detecting a voltage which comprises ohmically connecting at least one lead of a voltage source to a display comprising an array of a plurality of liquid crystal elements, said array comprising:
(a) a first liquid crystal element having a capacitance in the non-energized state lower than the capacitance of any other of said liquid crystal elements and comprising a liquid crystal material having a positive dielectric anisotropy so that said liquid crystal element has a capacitance in the energized state higher than its capacitance in the non-energized state; and
(b) a second liquid crystal element connected electrically in series with said first liquid crystal element, said second liquid crystal element having a capacitance in the non-energized state lower than the capacitance of the first liquid crystal element in its energized state.

* * * * *